US011335700B2

(12) United States Patent
Yip

(10) Patent No.: US 11,335,700 B2
(45) Date of Patent: May 17, 2022

(54) BLOCK-ON-BLOCK MEMORY ARRAY ARCHITECTURE USING BI-DIRECTIONAL STAIRCASES

(71) Applicant: Micron Technology, Inc., Boise, ID (US)

(72) Inventor: Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/208,868

(22) Filed: Mar. 22, 2021

(65) Prior Publication Data

US 2021/0288071 A1    Sep. 16, 2021

Related U.S. Application Data

(63) Continuation of application No. 16/716,947, filed on Dec. 17, 2019, now Pat. No. 10,978,478.

(51) Int. Cl.

| G11C 8/10 | (2006.01) |
|---|---|
| G11C 16/26 | (2006.01) |
| H01L 27/11582 | (2017.01) |
| H01L 27/11556 | (2017.01) |
| H01L 23/528 | (2006.01) |

(Continued)

(52) U.S. Cl.
CPC .... H01L 27/11582 (2013.01); G11C 11/5621 (2013.01); G11C 11/5671 (2013.01); G11C 16/08 (2013.01); G11C 16/24 (2013.01); H01L 21/32133 (2013.01); H01L 21/76892 (2013.01); H01L 23/5283 (2013.01); H01L 27/11556 (2013.01)

(58) Field of Classification Search
CPC ..... G11C 16/0483; G11C 16/08; G11C 16/26; G11C 16/10; G11C 16/14; G11C 16/3431; G11C 8/10; G11C 8/14
See application file for complete search history.

(56) References Cited

U.S. PATENT DOCUMENTS

| 8,179,720 B2 | 5/2012 | Fukuda et al. |
| 9,111,591 B2 | 8/2015 | Tanzawa |

(Continued)

OTHER PUBLICATIONS

Rino Micheloni, et al, "Architectural and Integration Options for 3D NAND Flash Memories", Computers 2017, 6, 27, Published Aug. 10, 2017.

(Continued)

*Primary Examiner* — Hien N Nguyen
(74) *Attorney, Agent, or Firm* — Greenberg Traurig

(57) ABSTRACT

A memory device stores data in non-volatile memory. The memory device includes a non-volatile memory array. The memory array includes tiers for accessing data stored in blocks of the memory array, including a block having a left block portion and a right block portion. A first staircase is positioned between the left block portion and the right block portion, and a bottom portion of the first staircase includes steps corresponding to first tiers of the left block portion. A second staircase is positioned between the left block portion and the right block portion, and a top portion of the second staircase includes steps corresponding to second tiers of the right block portion. The steps of the first staircase and the steps of the second staircase descend in opposite directions.

20 Claims, 17 Drawing Sheets

(51) Int. Cl.
*G11C 16/08* (2006.01)
*G11C 11/56* (2006.01)
*H01L 21/768* (2006.01)
*H01L 21/3213* (2006.01)
*G11C 16/24* (2006.01)

(56) References Cited

U.S. PATENT DOCUMENTS

| | | |
|---|---|---|
| 9,589,978 B1 | 3/2017 | Yip |
| 10,373,970 B2 | 8/2019 | Lee |
| 10,978,478 B1 * | 4/2021 | Yip ................ H01L 27/11556 |
| 2013/0051150 A1 | 2/2013 | Roizin et al. |
| 2015/0262932 A1 | 9/2015 | Yamane et al. |

OTHER PUBLICATIONS

Steve Shih-Wei Wang, "3D NAND: Challenges beyond 96-Layer Memory Arrays", retrieved from https://www.coventor.com/blog/3d-nand-challenges-beyond-96-layer-memory-arrays/ on Oct. 15, 2019. Posted on Oct. 12, 2018.

Yu De Chen; Jacky Huang, "Advanced Patterning Techniques for 3D NAND Devices", retrieved from https://www.coventor.com/blog/advanced-patterning-techniques-3d-nand-devices/on Oct. 15, 2019. Posted on Aug. 1, 2019.

\* cited by examiner

Top View

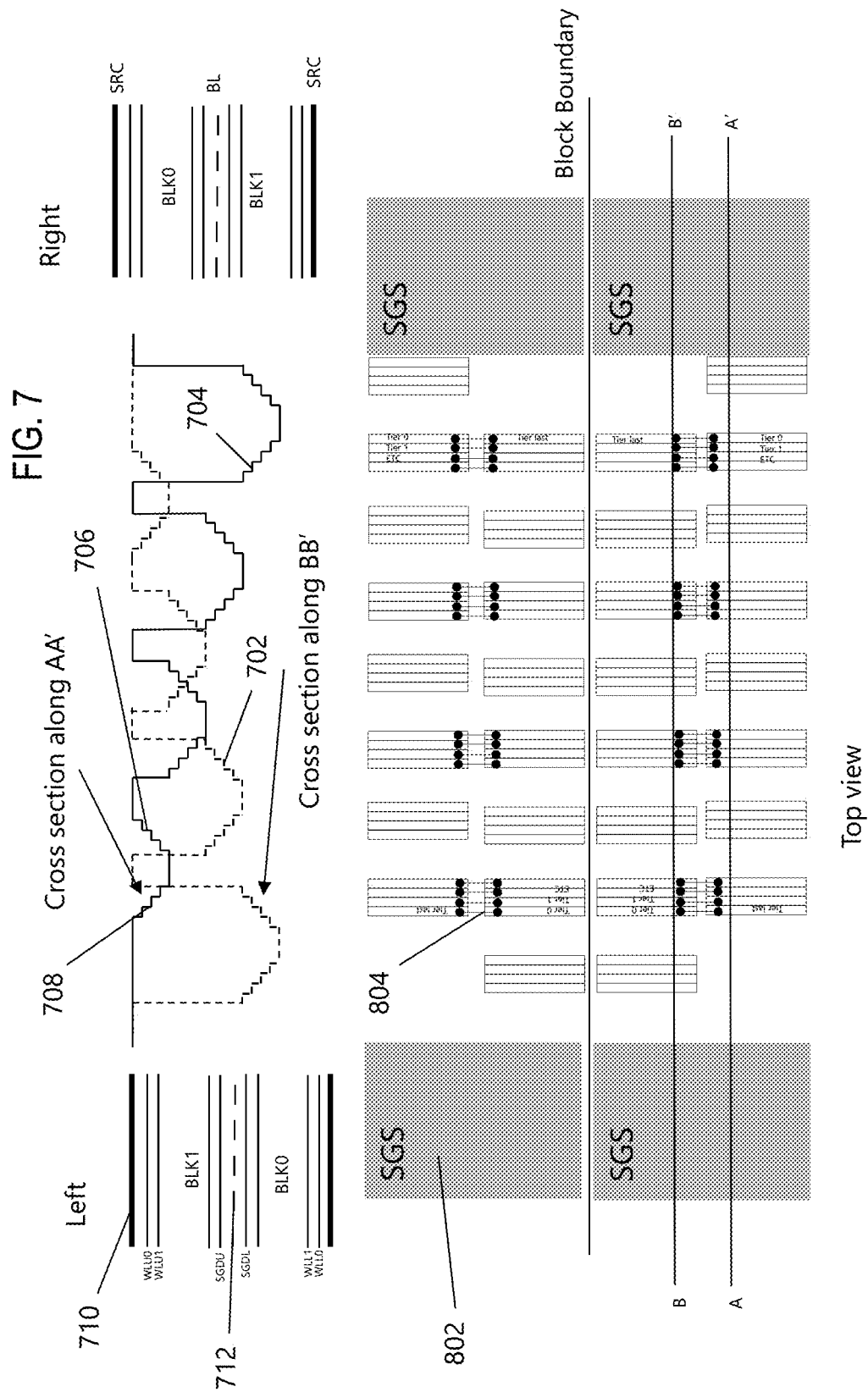

BLOCK-ON-BLOCK MEMORY ARRAY ARCHITECTURE USING BI-DIRECTIONAL STAIRCASES

RELATED APPLICATIONS

The present application is a continuation application of U.S. patent application Ser. No. 16/716,947, filed Dec. 17, 2019, and entitled "BLOCK-ON-BLOCK MEMORY ARRAY ARCHITECTURE USING BI-DIRECTIONAL STAIRCASES," the disclosure of which application is hereby incorporated by reference herein in its entirety.

The present application is related to U.S. Pat. No. 10,373,970, issued Aug. 6, 2019, titled "Semiconductor device structures including staircase structures, and related methods and electronic systems," by Eric N. Lee, the entire contents of which application is incorporated by reference as if fully set forth herein.

The present application is also related to U.S. Pat. No. 9,589,978, issued Mar. 7, 2017, titled "Memory devices with stairs in a staircase coupled to tiers of memory cells and to pass transistors directly under the staircase," by Aaron S. Yip, the entire contents of which application is incorporated by reference as if fully set forth herein.

FIELD OF THE TECHNOLOGY

At least some embodiments disclosed herein relate to memory devices in general, and more particularly, but not limited to vertical flash memory devices using staircases.

BACKGROUND

Various types of non-volatile storage devices can be used to store data. Non-volatile storage devices can include NAND flash memory devices. NAND flash is a type of flash memory constructed using NAND logic gates. Alternatively, NOR flash is a type of flash memory constructed using NOR logic gates. Currently, the use of NAND flash predominates the flash market.

Typical computer storage devices have controllers that receive data access requests from host computers and perform programmed computing tasks to implement the requests in ways that may be specific to the media and structure configured in the storage devices. In one example, a flash memory controller manages data stored in flash memory and communicates with a computer device. In some cases, flash memory controllers are used in solid state drives for use in mobile devices, or in SD cards or similar media for use in digital cameras.

Firmware can be used to operate a flash memory controller for a particular storage device. In one example, when a computer system or device reads data from or writes data to a flash memory device, it communicates with the flash memory controller.

In typical flash memories, NAND or NOR transistors are used to store information and are arranged in arrays or grids of gates accessible via bit and word lines, the intersection of which is referred to as a cell. The simplest flash memories store one bit of information per cell and are referred to as single-level cell (SLC) flash memories. In a multi-level cell (MLC) flash, a cell stores more than one bit of information. Specifically, traditionally MLC flash has stored two bits of information per cell. Correspondingly, triple-level cell (TLC) flash stores three bits of information per cell, and a quad-level cell (QLC) flash stores four bits of information per cell.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

The array of memory cells for NAND flash memory devices is typically arranged such that the control gate of each memory cell of a row of the array is connected together to form an access line, such as a word line. Columns of the array include strings (often termed NAND strings) of memory cells connected together in series, source to drain, between a pair of select transistors (e.g., a source select transistor and a drain select transistor). Each source select transistor is connected to a source line, while each drain select transistor is connected to a data line, such as a column bit line. A column is a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density (e.g., the number of memory cells in a given area of an integrated circuit die). One way to increase the density of memory devices is to form stacked memory arrays (e.g., often referred to as three-dimensional memory arrays).

The memory cells at a common location (e.g., at a common vertical level) in a stacked memory array, for example, may form a tier of memory cells. The memory cells in each tier might be coupled to one or more access lines, such as local access lines (e.g., local word lines), that are in turn selectively coupled to drivers by transistors, such as pass transistors. In some examples, the memory cells in each tier can be commonly coupled to a common access line or plate.

One way of increasing memory density in non-volatile memory devices is to utilize vertical memory array (e.g., a three-dimensional (3D) memory array) architectures. A conventional vertical memory array includes semiconductor pillars extending through openings in tiers of conductive structures (e.g., word line tiers or plates, control gate tiers or plates) and dielectric materials at each junction of the semiconductor pillars and the conductive structures. Such a configuration permits a greater number of switching devices (e.g., transistors) to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes fanning a so-called staircase structure at edges of the tiers of conductive structures. The staircase structure includes individual steps defining contact regions of the conductive structures upon which contact structures can be positioned to provide electrical access to the conductive structures. Unfortunately, conventional staircase structure fabrication techniques can segment one or more conductive structures of a given tier, resulting in discontinuous conductive paths through the tier that can require the use of multiple (e.g., more than one) switching devices to drive voltages completely across the tier and/or in opposing directions across the tier.

BRIEF DESCRIPTION OF THE DRAWINGS

The embodiments are illustrated by way of example and not limitation in the figures of the accompanying drawings in which like references indicate similar elements.

FIG. 7 is a cross-sectional view of a memory array having bi-directional distributed staircases, in accordance with some embodiments.

FIG. 8 is a top view of the memory array of FIG. 7, in accordance with some embodiments.

DETAILED DESCRIPTION

Figure 1:
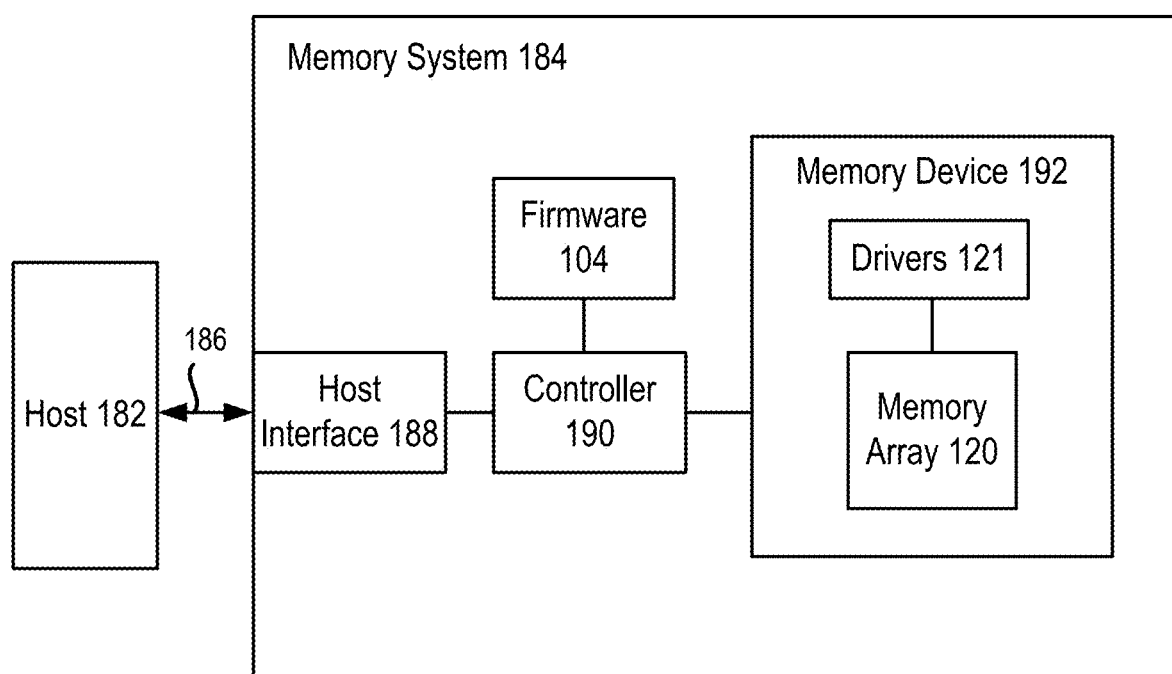
FIG. 1 illustrates a memory system having a controller that accesses data stored in a memory device, in accordance with some embodiments.

The following disclosure describes various embodiments for improving flash memory devices. At least some embodiments herein relate to memory devices including memory arrays that use bi-directional staircases. The memory device may, for example, store data used by a host device (e.g., a computing device of an autonomous vehicle, or another computing device that accesses data stored in the storage device). In one example, the storage device is a solid-state drive mounted in an electric vehicle.

Prior memory devices using a distributed staircase require the processing and formation of a connector bridge. An example of such memory device has a block-on-block NAND array. The bridge is difficult to process during manufacturing. Also, the bridge has a geometry that is very tall and skinny relative to its width, and thus is more susceptible to mechanical or other failure (e.g., by toppling or falling over during or after manufacture). This significantly degrades performance of the memory device by reducing the reliability of portions of the memory array. This can reduce the storage capacity of the memory device, and in some cases may cause a system failure.

One example of such problematic skinny structure above is shown in U.S. Pat. No. 10,373,970, issued Aug. 6, 2019, titled "Semiconductor device structures including staircase structures, and related methods and electronic systems," by Eric N. Lee.

Various embodiments of the present disclosure provide a technological solution to one or more of the above technical problems. In one embodiment, a memory device includes a memory array that uses bi-directional staircases with metal connectors providing an electrical connection between logically corresponding word-line tiers of the memory array.

In one embodiment, a memory device includes one or more non-volatile memory arrays. At least one of the non-volatile memory arrays includes tiers for accessing data stored in a plurality of blocks. The blocks include a first block having a left block portion and a right block portion. A first staircase is positioned between the left block portion and the right block portion, and a bottom portion of the first staircase includes steps corresponding to first tiers of the left block portion.

A second staircase is positioned between the left block portion and the right block portion, and a top portion of the second staircase includes steps corresponding to second tiers of the right block portion. The steps of the first staircase descend in a first direction, and the steps of the second staircase descend in a second direction that is opposite to the first direction.

It should be noted that the terms "left" and "right" as used to describe the block portions above are merely intended to illustrate a positioning of the block portions relative to the staircases above. No specific absolute left or right positioning is intended and/or required when manufacturing an actual memory device. Block portion positioning will typically vary for different memory device layouts.

In one embodiment, conductive connectors are used to electrically connect each of the first tiers of the left block portion to a corresponding one of the second tiers of the right block portion. Each corresponding first and second tier provides a logical word line for the first block.

In one embodiment, each conductive connector connects to a landing pad on a step of the first staircase and to a corresponding landing pad on a step of the second staircase. In one example, a contact to a topmost step (e.g., a step on the last word-line tier (e.g., Tier last)) of the first staircase is electrically connected to a contact to a bottommost step (e.g., a step on the initial word-line tier (e.g., Tier 0)) of the second staircase. The contacts are electrically connected using the conductive connector. In one example, the conductive connector is a metal connection or other metal structure (e.g., a metal routing or line structure). In one example, a contact to a bottommost step of the first staircase (e.g., Tier 0) is electrically connected to a contact to a topmost step of the second staircase (e.g., Tier last).

In one embodiment, each staircase includes steps, with each step corresponding to a tier. Each tier corresponds to a word-line layer. The tiers are stacked vertically above a semiconductor (e.g., a die or wafer). Each tier is a conductive layer separated from other conductive layers by an insulating layer. The steps of the staircase define contact regions of the conductive layers upon which contact structures can be positioned to provide electrical access to each conductive layer (e.g., by a contact as discussed above). In one example, the conductive layer is a polysilicon layer.

In one embodiment, multiple word-line lithography steps are used, with repeated vertical step etching and two-dimensional trimming at each staircase to provide the up and down step shape of the staircase as used in three-dimensional NAND devices. The staircase stretches out from the array of memory cells that are accessed using the word-line tiers.

FIG. 1 illustrates a memory system 184 having a controller 190 that accesses data stored in a memory device 192, in accordance with some embodiments. In one example, memory array 120 is a three-dimensional (3D) memory array. In some embodiments, multiple memory arrays 120 can be used.

Memory system 184 can be a solid state drive (SSD), for instance, and can include a host interface 188, controller 190 (e.g., a processor and/or other control circuitry), and memory device 192 (e.g., solid state memory devices such as NAND flash devices), which provides a storage volume for the memory system 184. Memory device 192 can include one or more memory array(s) 120.

In a number of embodiments, the controller 190, the memory device 192, and/or the host interface 188 can be physically located on a single die or within a single package (e.g., a managed NAND application).

Memory device 192 includes drivers 121 that are used to apply signals to word-line tiers of memory array 120. In one embodiment, controller 190 accesses data stored in a first block of memory array 120 using a first word line. One of drivers 121, under control of controller 190, is used to access the data by applying a signal to the first word line. The word line signal is applied to corresponding tiers of the left block portion and right block portion of the first block. These two tiers logically correspond to the first word line. In one embodiment, each pair of corresponding tiers is connected by a conductive connector as described above.

The controller 190 can be coupled to the host interface 188 and to the memory device 192 via one or more channels and can be used to transfer data between the memory system 184 and a host 182. Host interface 188 can be in the form of a standardized interface. For example, when the memory system 184 is used for data storage in a computing system, the host interface 188 can be a serial advanced technology attachment (SATA), peripheral component interconnect express (PCIe), or a universal serial bus (USB), among other connectors and interfaces. In general, however, host interface 188 can provide an interface for passing control, address, data, and other signals between the memory system 184 and host 182 (e.g., a host computing device having compatible receptors for the host interface 188).

Host 182 can be a host system such as a personal laptop computer, a desktop computer, a digital camera, a mobile telephone, or a memory card reader, among various other types of hosts. Host 182 can include a system motherboard and/or backplane and can include a number of memory access devices (e.g., a number of processors). Host 182 can be coupled to the host interface 188 by a communication channel 186.

The controller 190 can communicate with the memory device 192 to control data read, write, and erase operations, among other operations, including equalization, discharge, and string driver operations. The controller 190 can include, for example, a number of components in the form of hardware and/or firmware (e.g., one or more integrated circuits), and/or software for controlling access to the memory device 192 and/or for facilitating data transfer between the host 182 and the memory device 192. In some embodiments, multiple memory devices can be used.

The memory device 192 can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells, and an array can include a number of planes.

In some embodiments, host 182 can be a computer (e.g., mobile phone or other computing device) having one or more central processing units (CPUs) to which computer peripheral devices, such as the memory system 184, may be attached via an interconnect, such as a computer bus.

The computer storage device 103 can be used to store data for the host 182. Examples of memory system 184 include solid state drives, flash memory, etc.

Controller 190 can run firmware 104 to perform operations responsive to the communications from the host 182. Firmware in general is a type of computer program that provides control, monitoring, and data manipulation of engineered computing devices. In FIG. 1, the firmware 104 controls the operations of the controller 190 in operating the memory system 184, such as translating a logical address to a physical address for storing and accessing data in the memory device 192. In one example, the controller 190 is an internal controller of a managed NAND device that stores data in TLC NAND flash memory.

An example of non-volatile storage media used in memory array 120 is memory cells (e.g., SLC, TLC, QLC) in an integrated circuit. The storage media is non-volatile in that no power is required to maintain the data/information stored in the non-volatile storage media, which data/information can be retrieved after the non-volatile storage media is powered off and then powered on again. The memory cells may be implemented using various memory types, such as NAND gate based flash memory, phase-change memory (PCM), magnetic memory (MRAM), resistive random-access memory, and 3D XPoint, such that the storage media is non-volatile and can retain data stored therein without power for days, months, and/or years.

In one embodiment, during operation, controller 109 receives various commands from host 182. These commands can include a read command or a write command. In one example, a read command includes a logical address, and is received from host 182 to access stored data in non-volatile storage media of memory array 120.

In one example, controller 190 receives a logical address and determines a physical address. The physical address that is determined is used to read that portion of stored data that corresponds to the received logical address. Controller 190 then sends the read data to host 182. In some instances, the controller 190 has multiple processors, each having its own in-processor cache memory.

The memory system 184 can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage.

At least some embodiments of the disclosures herein can be implemented using computer instructions executed by the controller 190, such as the firmware 104. In some instances, hardware circuits can be used to implement at least some of the functions of the firmware 104. The firmware 104 can be initially stored in the non-volatile storage media of memory array 120, or another non-volatile device, and loaded into volatile memory (not shown) and/or in-processor cache memory for execution by the controller 190.

A non-transitory computer storage medium can be used to store instructions of the firmware 104. When the instructions are executed by the controller 190 of the memory system 184, the instructions cause the controller 190 or other processing device(s) to perform methods as discussed herein.

In one embodiment, a local manager (not shown) of memory system 184 receives data access commands. A data access request (e.g., read, write) from the host 182 identifies an LBA address to read, write, or erase data from a memory unit identified by the LBA address. The local manager translates the logical address to a physical address.

In one embodiment, a controller is implemented by one or more processing devices. The processing device can be, for example, a microprocessor, a central processing unit (CPU), a processing core of a processor, an execution unit, etc. The processing device can be, for example, a microcontroller, special purpose logic circuitry (e.g., a field programmable gate array (FPGA), an application specific integrated circuit (ASIC), etc.), or another suitable processor.

In some embodiments, the controller includes a host I/O management component, a flash translation layer (FTL), and a memory unit management component.

In embodiments in which the memory (e.g., non-volatile storage media) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller is configured to write/read to/from the non-volatile storage media as part of a single write/read operation and can be referred to as a "flash page". As an example, a memory device may have a page size of 8 KB (kilobytes) and may be configured to store 128 pages of data per block, 2048 blocks per plane, and 16 planes per device.

Unlike with traditional hard disk drives, data stored in flash arrays cannot be directly overwritten. That is, a block of flash cells must be erased prior to rewriting data thereto (e.g., a page at a time). In some embodiments, the controller can manage data transferred between the host processor and the flash arrays via a logical-to-physical mapping scheme. For instance, a flash translation layer can employ a logical addressing scheme (e.g., logical block addressing (LBA)). As an example, when new data received from the host processor is to replace older data already written to the flash array, the controller can write the new data in a new location on the non-volatile storage media and the logical-to-physical mapping of the FTL can be updated such that the corresponding logical address(es) associated with the new data being written indicates (e.g., points to) the new physical location. The old location, which no longer stores valid data, will be erased prior to being written again.

Figure 2:
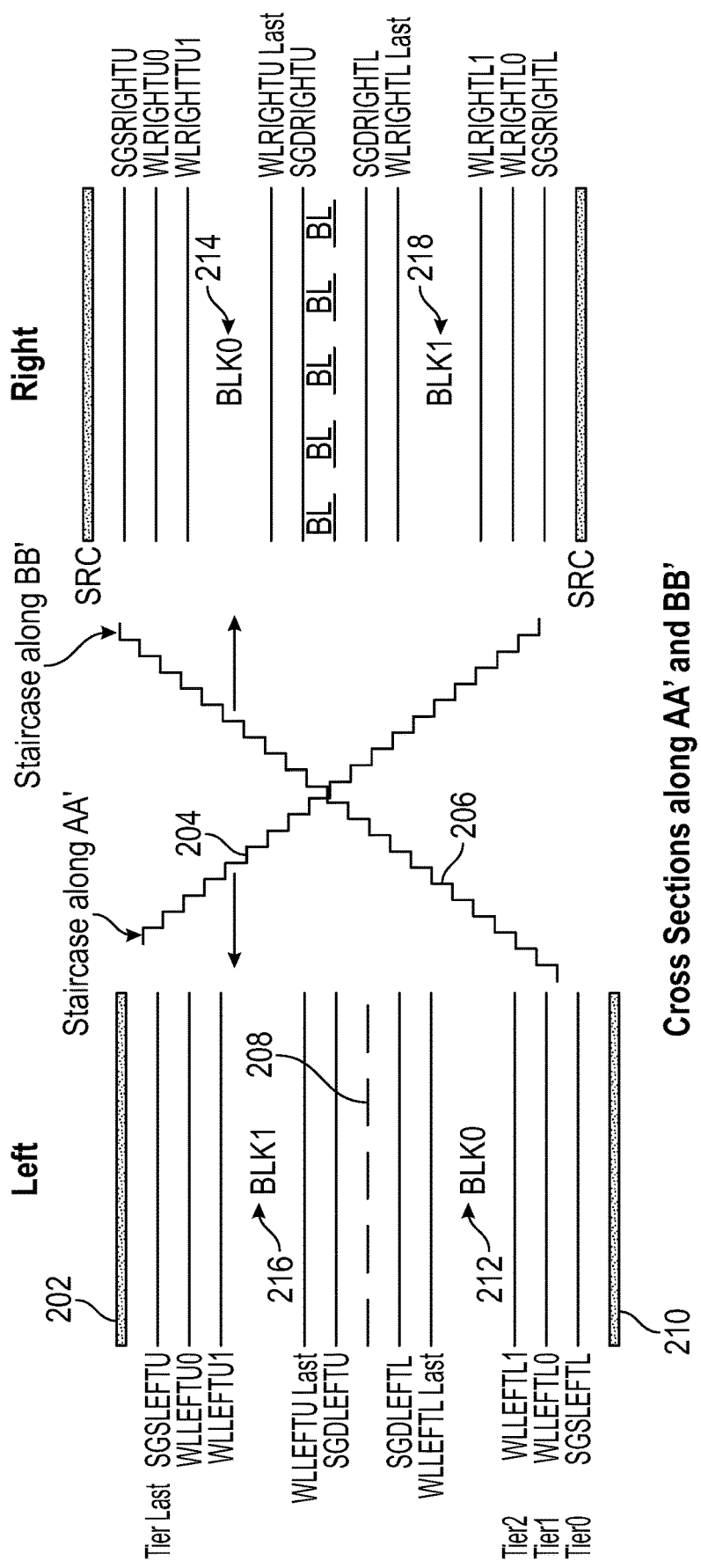
FIG. 2 is a simplified cross-sectional view of a memory array including bi-directional staircases and having a source at the top and bottom of the memory array, in accordance with some embodiments.

FIG. 2 is a simplified cross-sectional view of a memory device including a memory array having bi-directional staircases 204, 206 and having a source 202, 210 at the top and bottom of the memory array, in accordance with some embodiments. In one example, the illustrated memory array is memory array 120 of FIG. 1. Staircase 204 corresponds to cross-section AA' of FIG. 3, and staircase 206 corresponds to cross-section BB' of FIG. 3. Staircases 204 and 206 are shown in a simplified form in FIG. 2. In an actual memory device, it is understood that staircase 206 is located behind staircase 204. As illustrated, a topmost step of staircase 204 corresponds to "Tier last" of the memory array, and a bottommost step of staircase 204 corresponds to "Tier 0" of the memory array.

In one example, source 202 or 210 is a source structure such as a source line, a source plate, or a common source formed in a semiconductor substrate. Bit lines 208 (indicated by "BL") are positioned in the middle of the memory array.

It should be noted that for purposes of illustration, the structure of the staircases 204, 206 is shown in a simplified form. In an actual memory device, each staircase is typically formed as a distributed staircase (e.g., including stadiums with dummy treads, such as discussed below).

As illustrated, the steps of each staircase descend in opposite directions. For example, the steps of staircase 204 descend downward in a direction towards right block portions 214, 218. The steps of staircase 206 descend downward in the opposite direction towards left block portions 212, 216.

In one embodiment, the memory device includes a stacked (e.g., three-dimensional) memory array. The memory array includes blocks of memory cells (e.g., blocks that may be erased concurrently).

In one example, as illustrated, a first block (indicated by "BLK0") of the memory array includes lower left block portion 212 and upper right block portion 214. A second block (indicated by "BLK1") of the memory array includes upper left block portion 216 and lower right block portion 218.

In one example, each block can store at least 16K bytes of data. 8K bytes are stored in the left block portion, and 8K bytes are stored in the right block portion.

In one embodiment, the memory array (e.g., blocks BLK0 and BLK1) is formed over a semiconductor structure (not shown) (e.g., a semiconductor wafer or die).

The semiconductor is, for example, a layer of material, a wafer, a substrate, or other base semiconductor structure. Further examples of the semiconductor include structures formed using silicon-on-sapphire (SOS) technology, silicon-on-insulator (SOI) technology, thin film transistor (TFT) technology, doped and undoped semiconductors, epitaxial layers of a silicon supported by a base semiconductor structure, and other semiconductor structures.

In one example, a block of the memory array includes tiers of memory cells (note: the memory cells themselves are not shown). The tiers of memory cells are respectively at different levels (e.g., vertical levels). For example, the vertical levels may be formed in a direction that is substantially perpendicular to a base structure, such as a surface of an integrated circuit die.

In one embodiment, the memory cells in each tier may be at a common vertical level and may be commonly coupled to a word line. In one example, the word line can include a planar conductor to which the memory cells in the tier are commonly coupled.

In one example, as illustrated, each word line corresponds to a tier. For example, as illustrated in FIG. 2, Tier 1 corresponds to WLEFTL0, and Tier 2 corresponds to WLEFTL1. Some tiers correspond to select gate source (e.g., SGSLEFTU) and select gate drain transistors (SGDLEFTU) of the memory array, as is also illustrated.

In one embodiment, each source select transistor is connected to a source (e.g., a source line). Each drain select transistor is connected to a data line (e.g., a bit line). In one embodiment, the memory device is a 3D NAND flash memory device.

In one embodiment, the memory cells in a tier may be located at intersections of an access plate for that tier and a plurality of vertical structures. Each vertical structure can include a vertical semiconductor (e.g., forming a core of the respective structure), such as a pillar, and a charge-storage structure adjacent to (e.g., on) the semiconductor. An access plate may be coupled to or include a control gate of a memory cell at each intersection of that access plate and one of the vertical structures.

Figure 3:
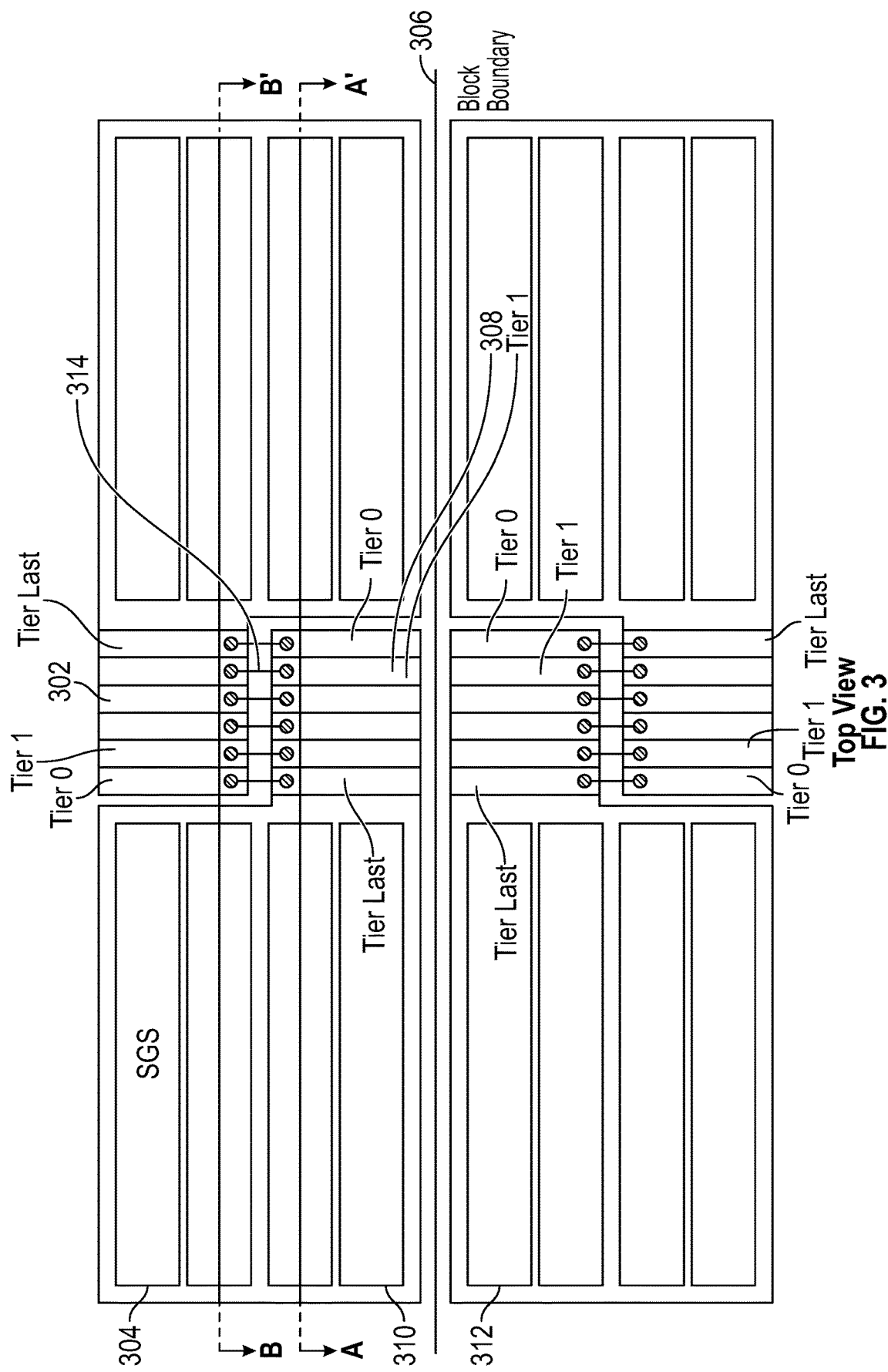
FIG. 3 is a simplified top view of the memory array of FIG. 2, in accordance with some embodiments.

FIG. 3 is a simplified top view of the memory array of FIG. 2, in accordance with some embodiments. Staircase 204 has steps 308, as illustrated. Staircase 206 has steps 302. Each step corresponds to a tier of the memory array. Corresponding tiers of staircases 204, 206 are electrically connected using conductive connectors 314. For example, Tier 0 is electrically connected to Tier last, as illustrated. In this way, left and right portions of corresponding word lines in a block (e.g., BLK0) of the memory array are electrically connected.

In one embodiment, a signal is applied to the left and right portions of each word line using a driver circuit that is electrically connected to the corresponding conductive connector 314. In one example, the driver circuit is one of drivers 121 of FIG. 1.

In one embodiment, conductive connector 314 can include a conductive contact structure. In one example, the contact structure is a conductive plug or a conductive vertical interconnect. In one embodiment, conductive connector 314 can also include conductive routing structures. In one example, the routing structure is a conductive interconnect.

A source layer 304 (indicated as SGS in FIG. 3) overlies left and right block portions of the memory array, as illustrated. Sub-blocks 310, 312 of the memory array are positioned underlying the source layer 304. Sub-blocks 310, 312 are selected using signals applied to select gate drain transistors (e.g., using SGDLEFTU).

In one embodiment, each of staircases 204, 206 spans two sub-blocks of the memory array, as illustrated. In other embodiments, each staircase may span more than two sub-blocks.

In one embodiment, each pair of bi-directional staircases 204, 206 has a layout that repeats on a two-block basis, as illustrated. For example, staircases 204, 206 are symmetrical with the other two corresponding staircases of the layout along block boundary 306, as illustrated.

Referring again to FIG. 2, the word line order for each of the left and right block portions of respective blocks in the memory array is opposite. In one example, the left block portion 212 has a word line order starting from an initial left word line (WLLEFTL0) and continuing to a last left word line (WLLEFTL last) moving in an upward vertical direction. The corresponding right block portion 214 has a word line order starting from an initial right word line (WLRIGHTU0) and continuing to a last right word line (WLRIGHTU last) in a downward vertical direction. The initial left word line is electrically connected to the initial right word line, and the last left word line is electrically connected to the last right word line.

Figure 4:
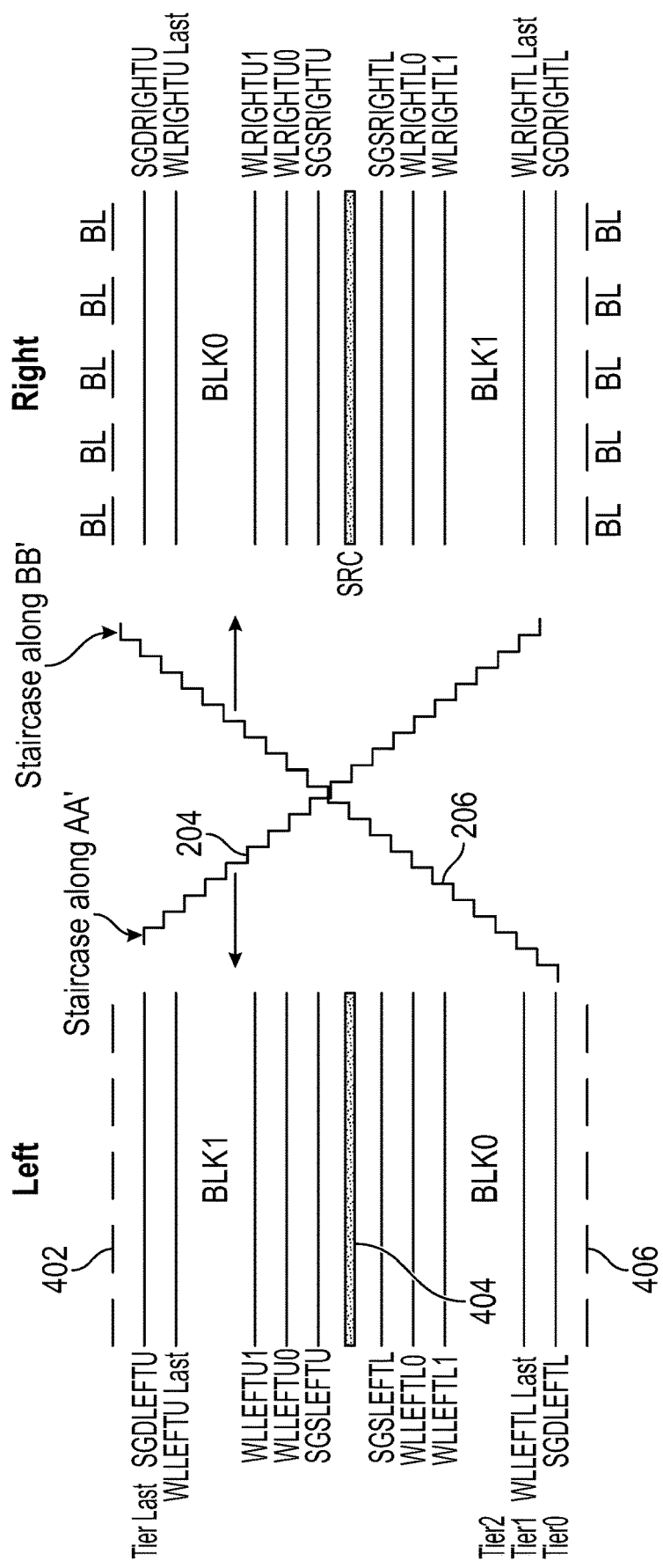
FIG. 4 is a simplified cross-sectional view of a memory array including bi-directional staircases and having bit lines at the top and bottom of the memory array, in accordance with some embodiments.

FIG. 4 is a simplified cross-sectional view of a memory array including bi-directional staircases 204, 206 and having bit lines 402, 406 (e.g., indicated as "BL") at the top and bottom of the memory array, in accordance with some embodiments. Source 404 is a source structure positioned in the middle of the memory array between upper and lower block portions. Examples of source 404 include a source line or a source plate. The positions of the select gate drain and select gate source layers in FIG. 4 are correspondingly reversed from that shown in FIG. 2. Also, the ordering of the word line tiers is correspondingly reversed. Otherwise, the structure of the memory array can be similar to the memory array structure as described for FIGS. 2 and 3 above.

Figure 5:
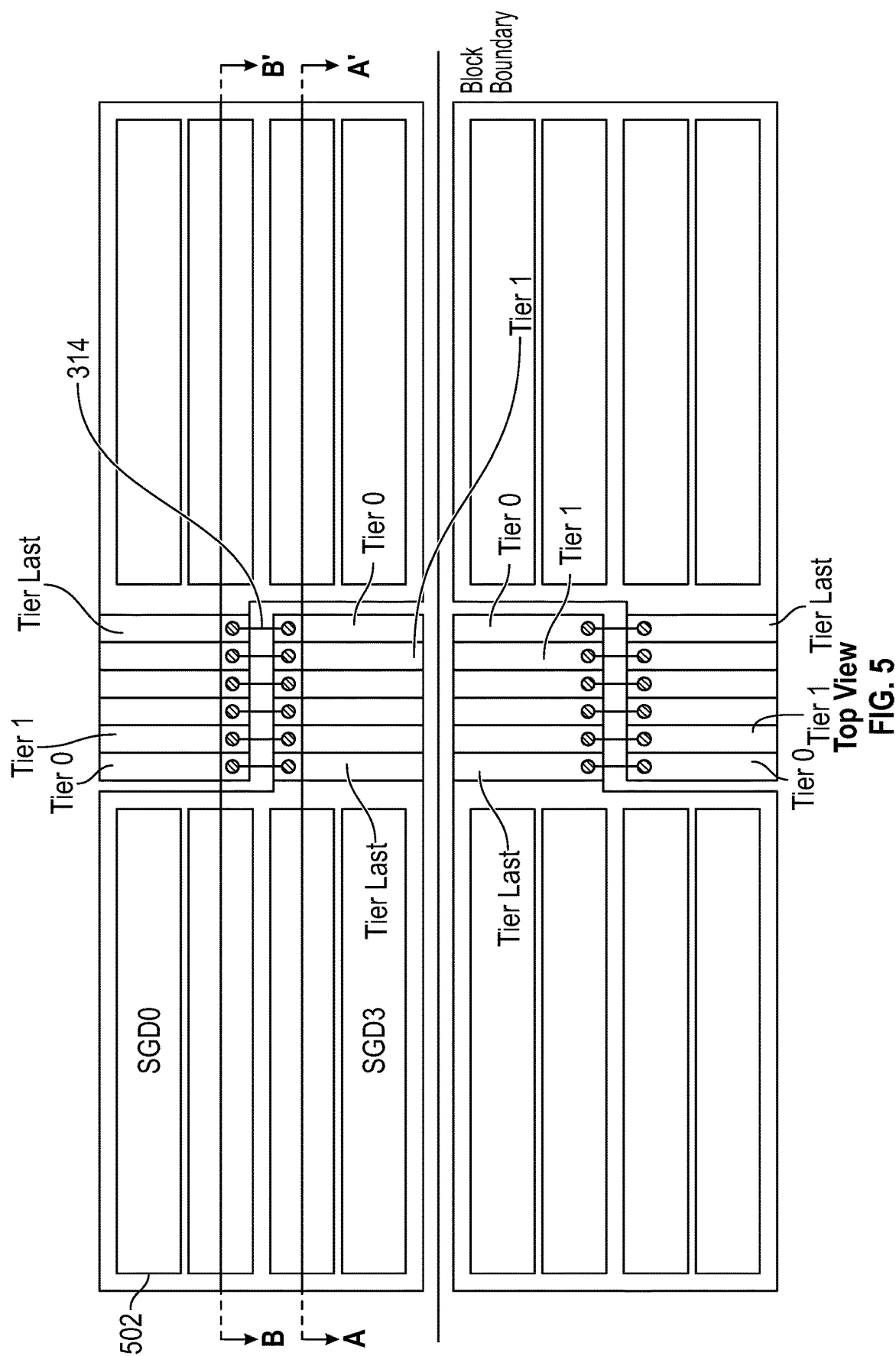
FIG. 5 is a simplified top view of the memory array of FIG. 4, in accordance with some embodiments.

FIG. 5 is a simplified top view of the memory array of FIG. 4, in accordance with some embodiments. As illustrated, select gate drain sub-blocks 502 (indicated as SGD0-3) are positioned at the top of the memory array, in contrast to the interior sub-block location for the memory array of FIG. 3. Conductive connectors 314 in FIG. 5 are similar as described for FIG. 3 above. Also, the layout can be symmetrical about the block boundary as described above.

Figure 6:
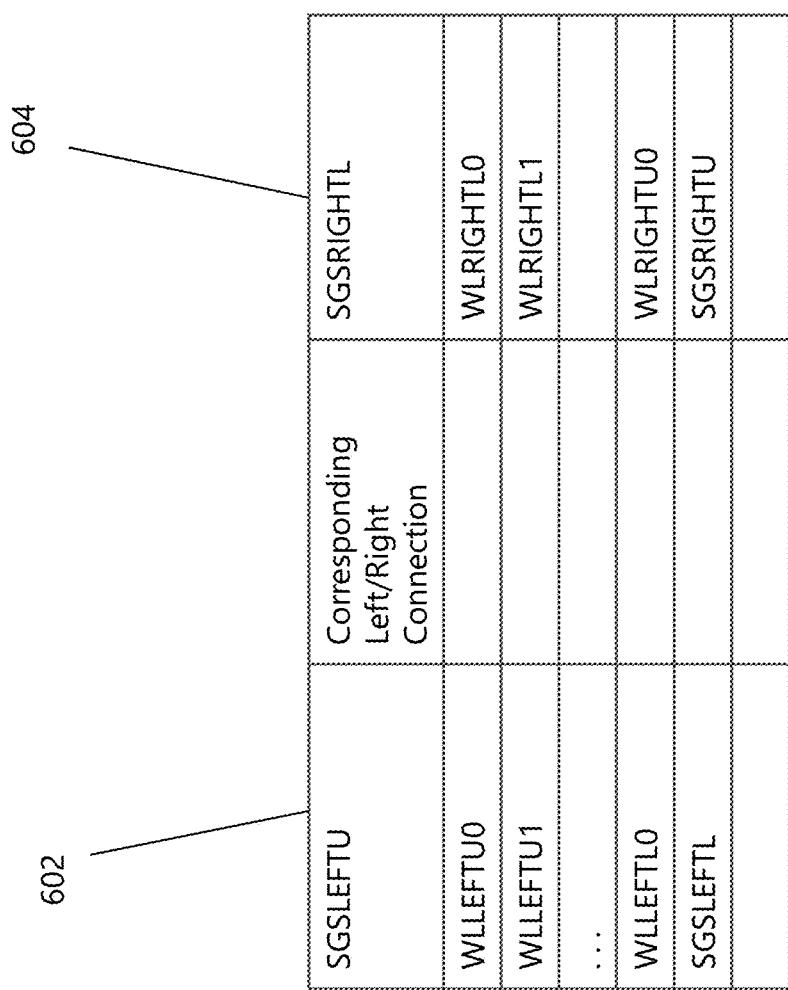
FIG. 6 is a table that illustrates a connection correspondence between left and right block portions of a block in the memory array of FIG. 2, in accordance with some embodiments.

FIG. 6 is a table that illustrates a connection correspondence between left block portions 602 and right block portions 604 of a block (e.g., BLK1) in the memory array of FIG. 2, in accordance with some embodiments. For example, the tier corresponding to WLLEFTU0 is electrically connected to the tier corresponding to WLRIGHTL0. This electrical connection is implemented using one of conductive connectors 314, as discussed above. Other tiers of the memory array are similarly connected as indicated in FIG. 6.

FIG. 7 is a cross-sectional view of a memory array having bi-directional distributed staircases 702, 704, in accordance with some embodiments. Staircase 704 corresponds to cross-section AA' of FIG. 8, and staircase 702 corresponds to cross-section BB' of FIG. 8. A source 710 is positioned at the top of the memory array, and bit lines 712 are positioned in the middle of the memory array. In one example, staircases 702, 704 are an implementation of staircases 204, 206 of FIG. 2.

Each of staircases 702, 704 is a distributed staircase having a plurality of stadiums. For example, a first stadium of staircase 704 has a shape defined by ends 708 of respective active tiers of the upper block portion of block BLK1 and further defined by ends 706 of dummy treads (inactive remnants) that correspond to the respective active tiers and remain after formation of the distributed staircase structure.

FIG. 8 is a top view of the memory array of FIG. 7, in accordance with some embodiments. A source structure 802 (indicated by "SGS") is positioned at the top of the memory array. Source structure 802 is an example of source layer 304 of FIG. 3.

Conductive connectors 804 are used to electrically connect corresponding word-line tiers similarly as discussed above. Conductive connectors 804 are an example of conductive connectors 314 of FIG. 3. The layout of distributed staircase pairs in FIG. 8 is symmetrical about a block boundary, similarly as discussed above.

Figure 9:
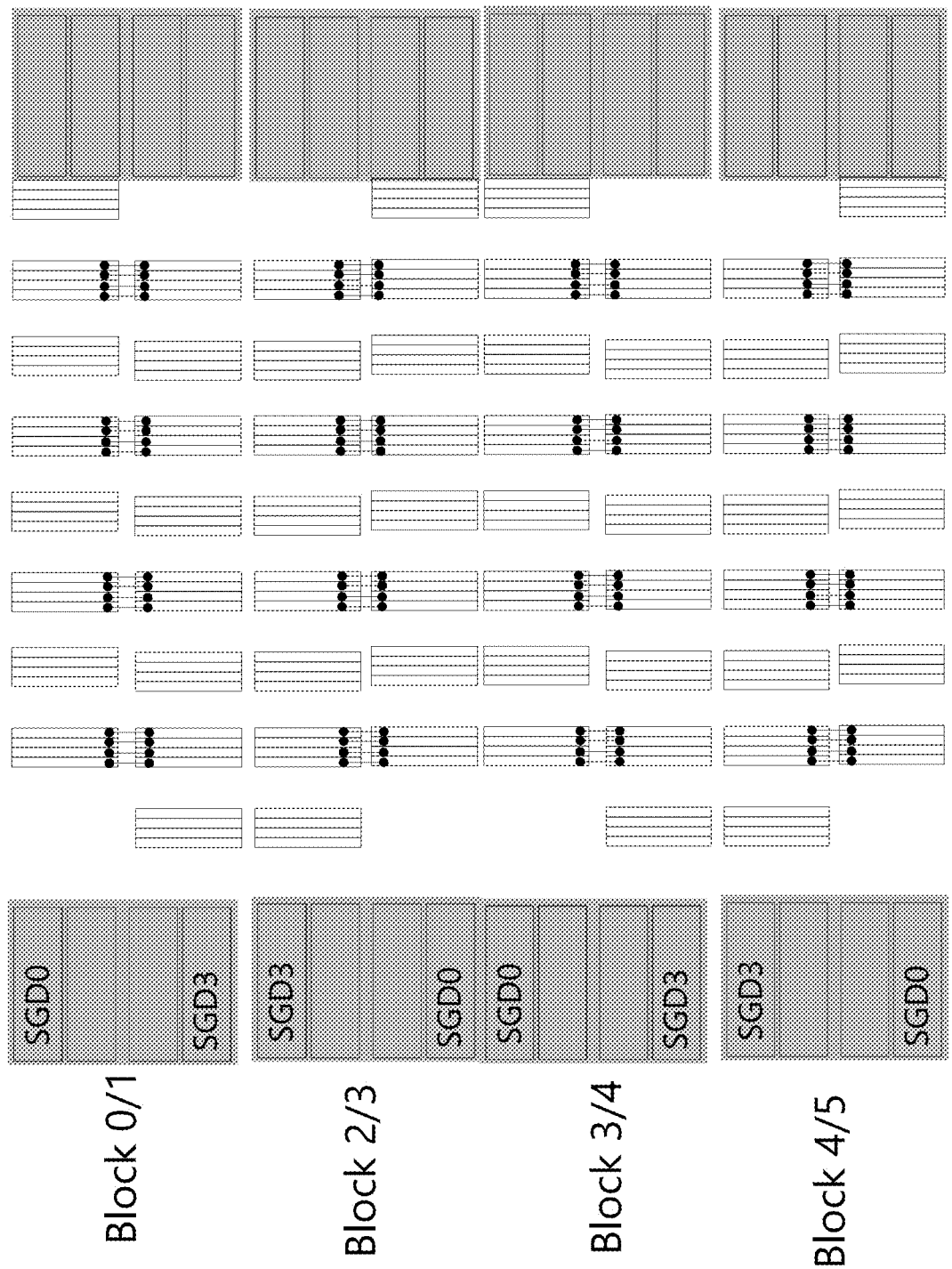
FIG. 9 is a layout view of blocks in a memory device, in accordance with some embodiments.

FIG. 9 is a layout view of blocks in a memory device, in accordance with some embodiments. As illustrated and similarly as discussed above (e.g., for FIG. 3), the blocks of the memory array symmetrically repeat on a two-block basis (e.g., the layout for Block 2/3 repeats symmetrically to the layout for Block 0/1). In one example, the layout illustrated in FIG. 9 corresponds to repeating the block layout of the memory array of FIG. 8.

FIGS. 10-17 illustrate a method for manufacturing a distributed staircase of a memory device, in accordance with some embodiments. In one example, the distributed staircase is staircase 702 and/or 704 of FIG. 7.

Figure 10:
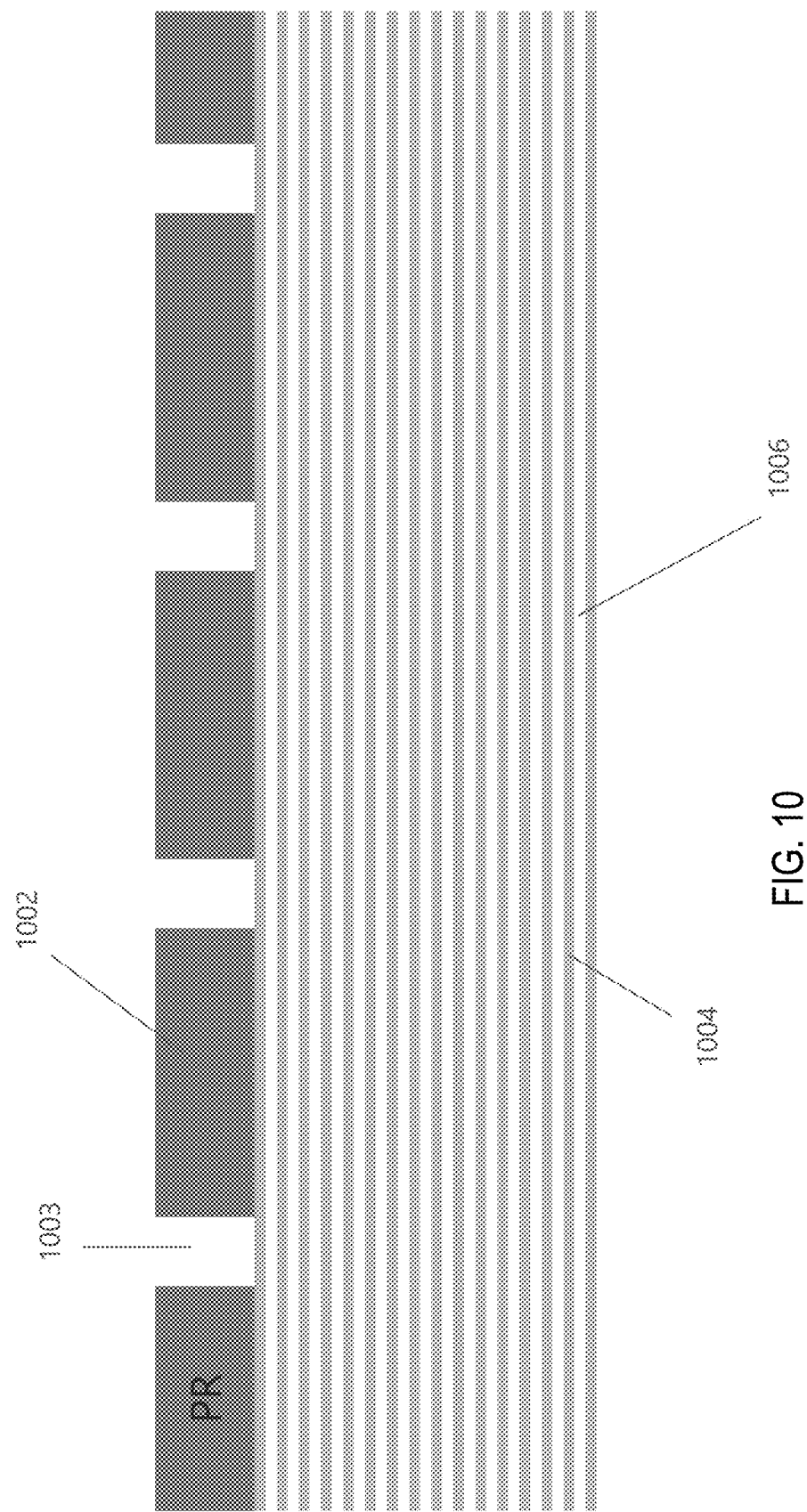
FIGS. 10-17 illustrate a method for manufacturing a distributed staircase of a memory device, in accordance with some embodiments.

In FIG. 10, conductive layers 1004 are separated by insulating layers 1006. Each of conductive layers 1004 will later provide a word-line tier. In one example, each word-line tier is one of the tiers of block portion 212 of FIG. 2, or the lower left block portion of block BLK0 of FIG. 7. In one example, a memory array can include 32-176 conductive layers. In one example, the conductive layers 1004 have been previously formed overlying a semiconductor substrate.

A photoresist layer 1002 is formed overlying conductive layers 1004. Openings 1003 are then formed in photoresist layer 1002.

Figure 11:
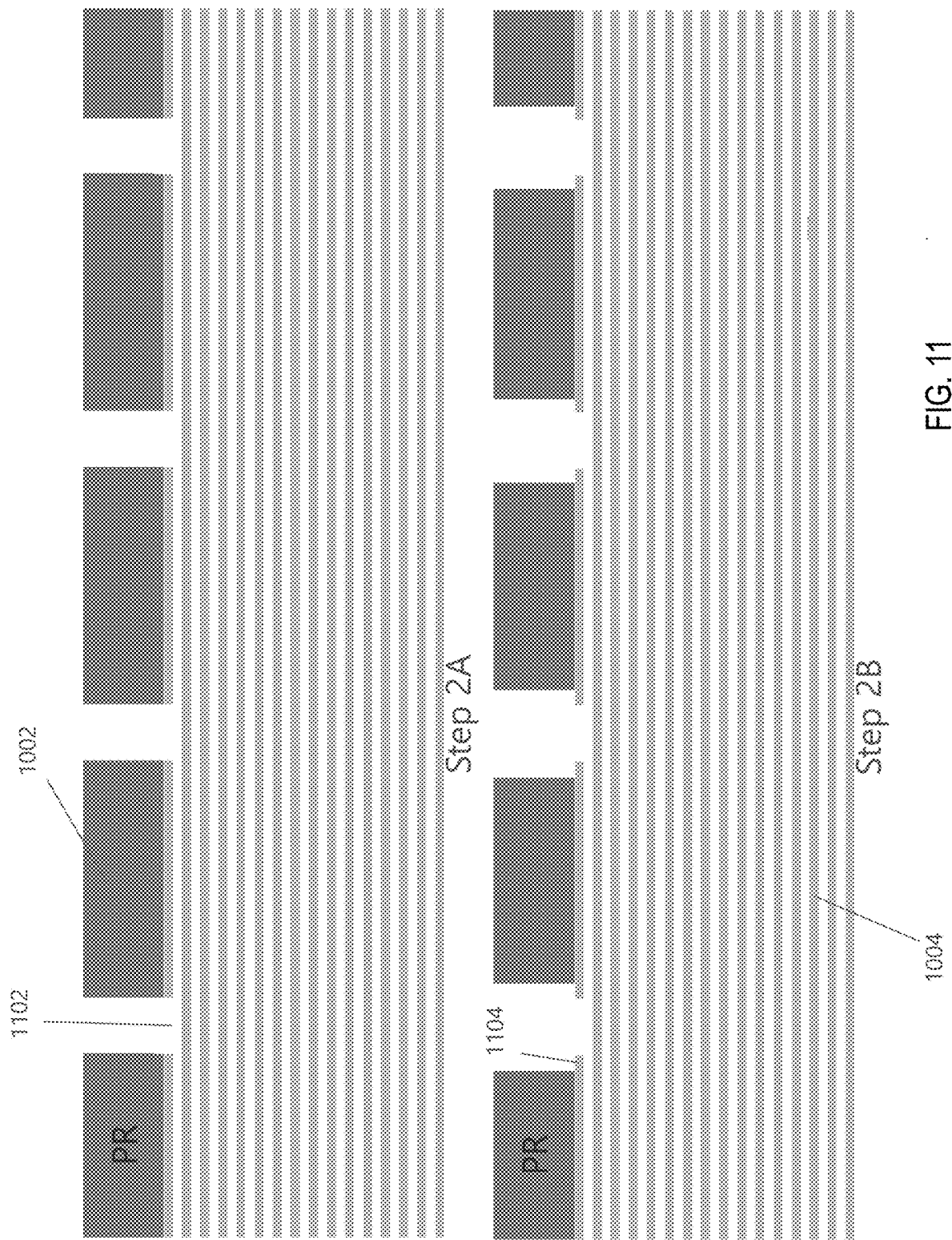

In FIG. 11, the first of several repeated trim and etch sequences is performed. Specifically, an opening 1102 is formed using a vertical etch of the topmost conductive layer using photoresist 1002 as a mask (Step 2A). Then, a trim etch is performed on photoresist 1002 to expose a top surface portion 1104 of the top conductive layer (Step 2B). Surface portion 1104 will later be used to provide a landing pad for contacting the topmost conductive layer (e.g., using a vertical contact structure).

Figure 12:
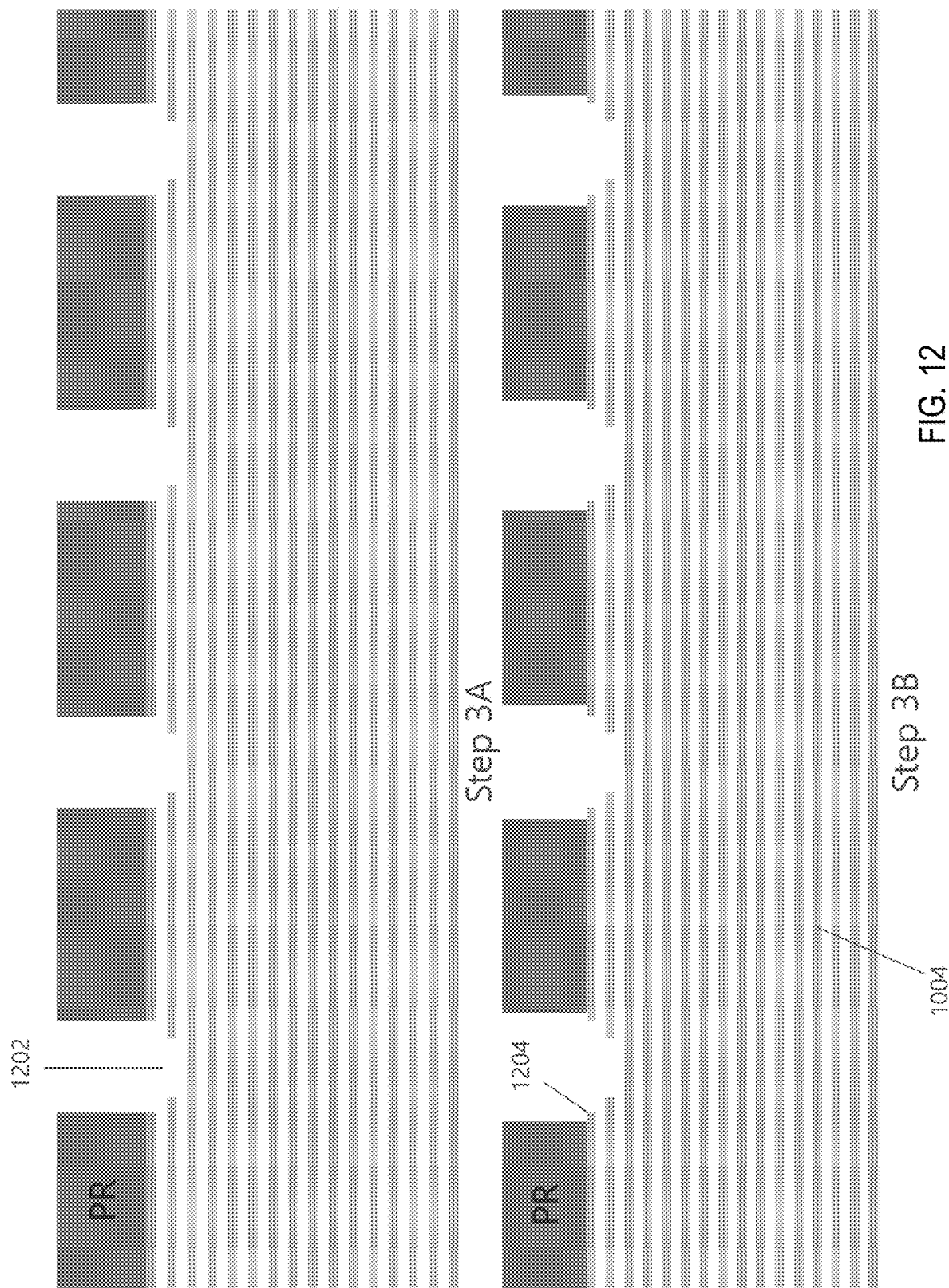

In FIG. 12, another trim and etch sequence is performed. A vertical etch using the trimmed photoresist layer from above provides opening 1202 in the next lower conductive layer (Step 3A). The photoresist layer is trimmed again to provide exposed surface portion 1204 of this conductive layer (Step 3B).

Figure 13:
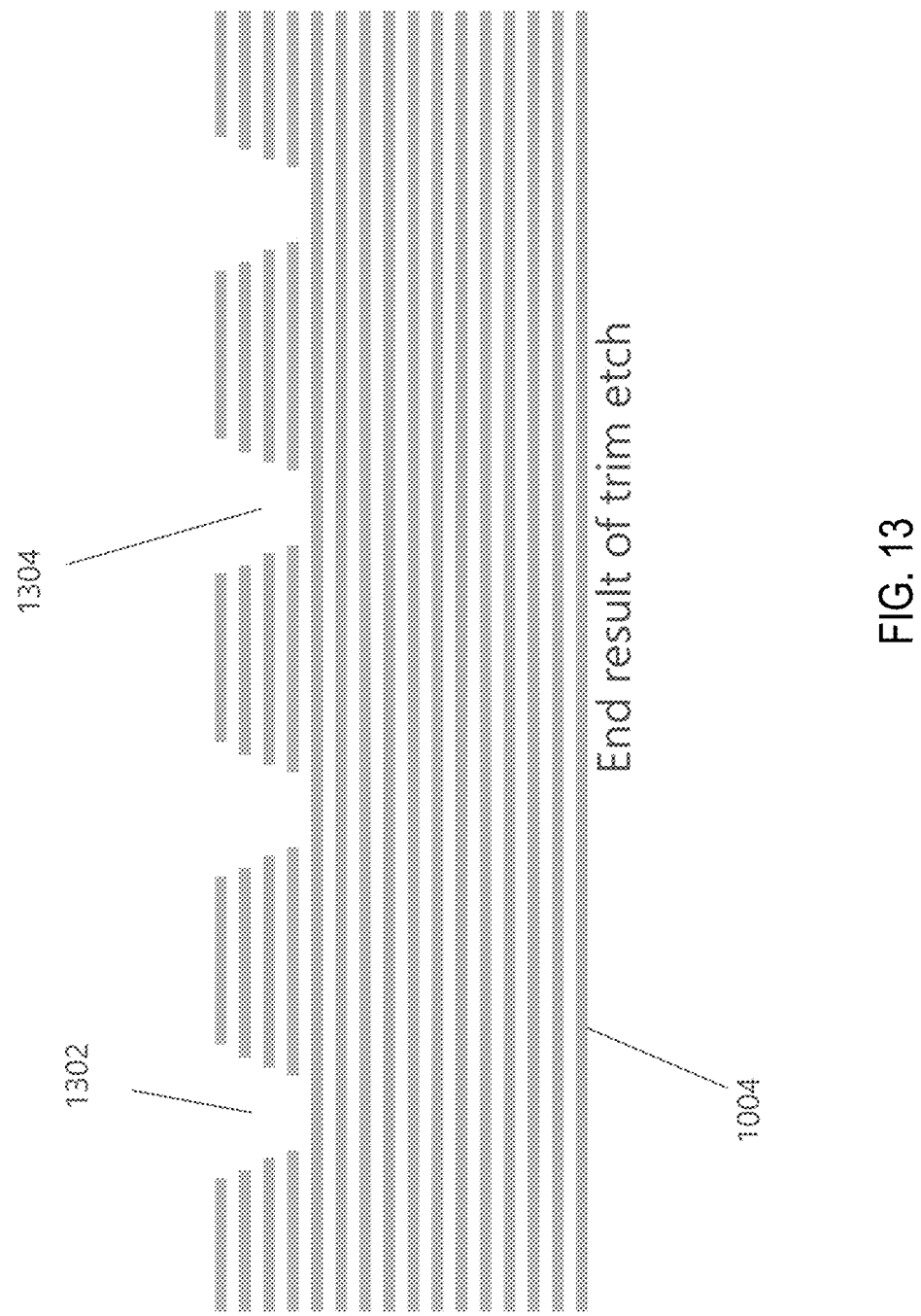

In FIG. 13, the trim and etch sequences are repeated as necessary to provide openings 1302 and 1304 in the upper ones of the conductive layers 1004, as illustrated. Photoresist layer 1002 has been removed.

Figure 14:
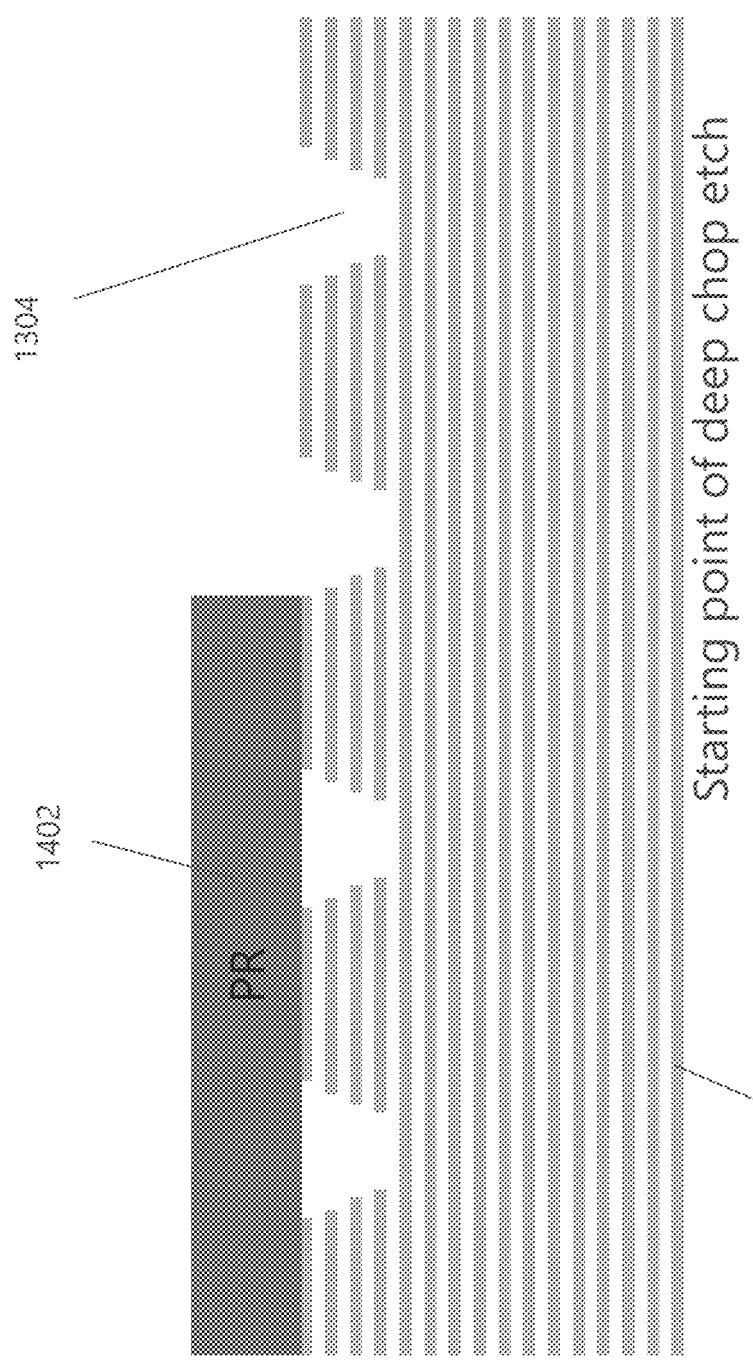

In FIG. 14, a photoresist layer 1402 is formed over only a portion of the openings previously formed above in the topmost conductive layers. For example, this leaves openings 1304 exposed.

Figure 15:
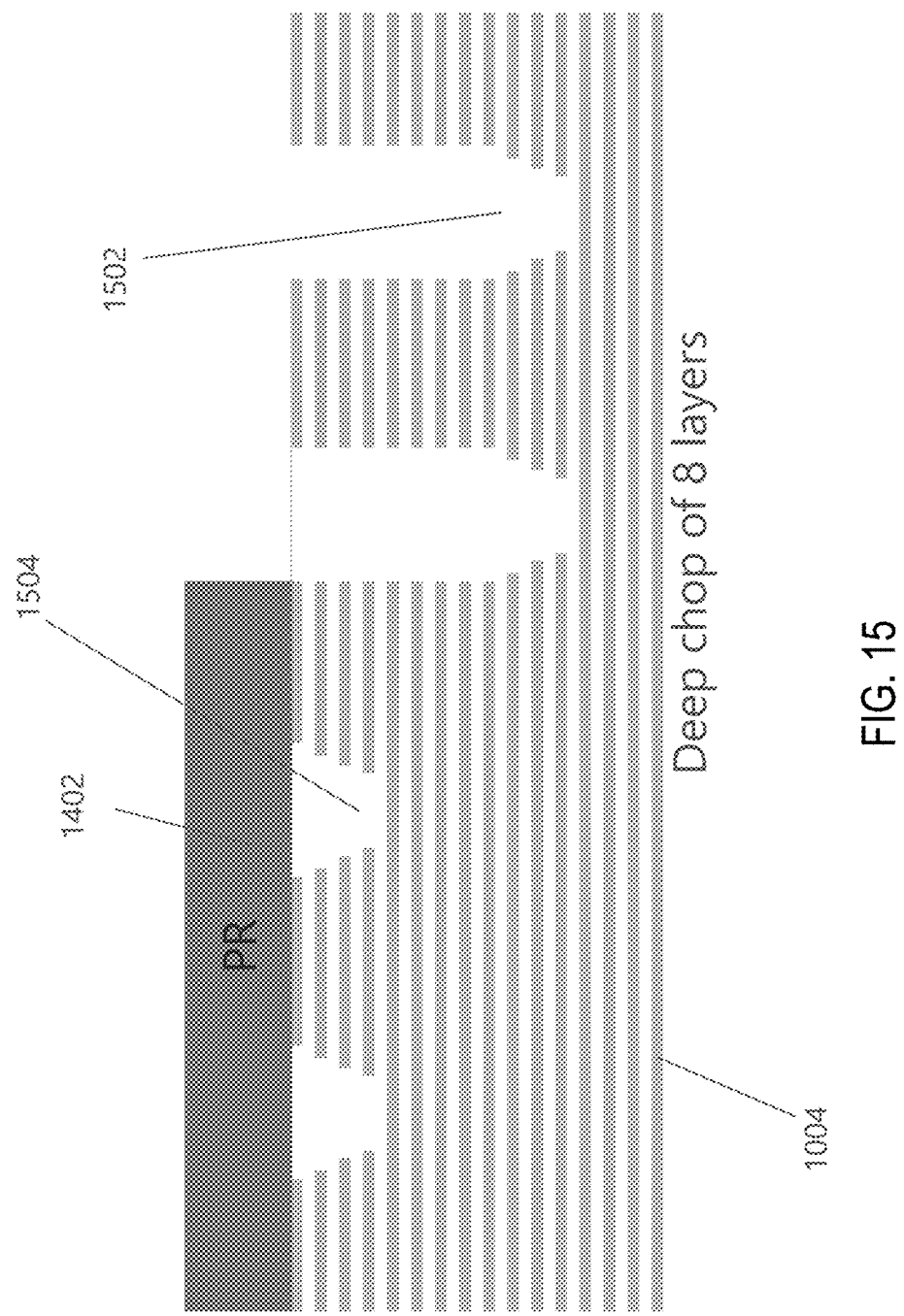

In FIG. 15, a deep chop etch (e.g., an etch of 8 layers) is performed to extend the depth of the exposed openings 1304. After performing the etch, openings 1502 are provided at a greater depth into the stack of conductive layers 1004. The openings 1504 are protected from the etch by photoresist layer 1402. After the etch is completed, photoresist layer 1402 is removed.

Figure 16:
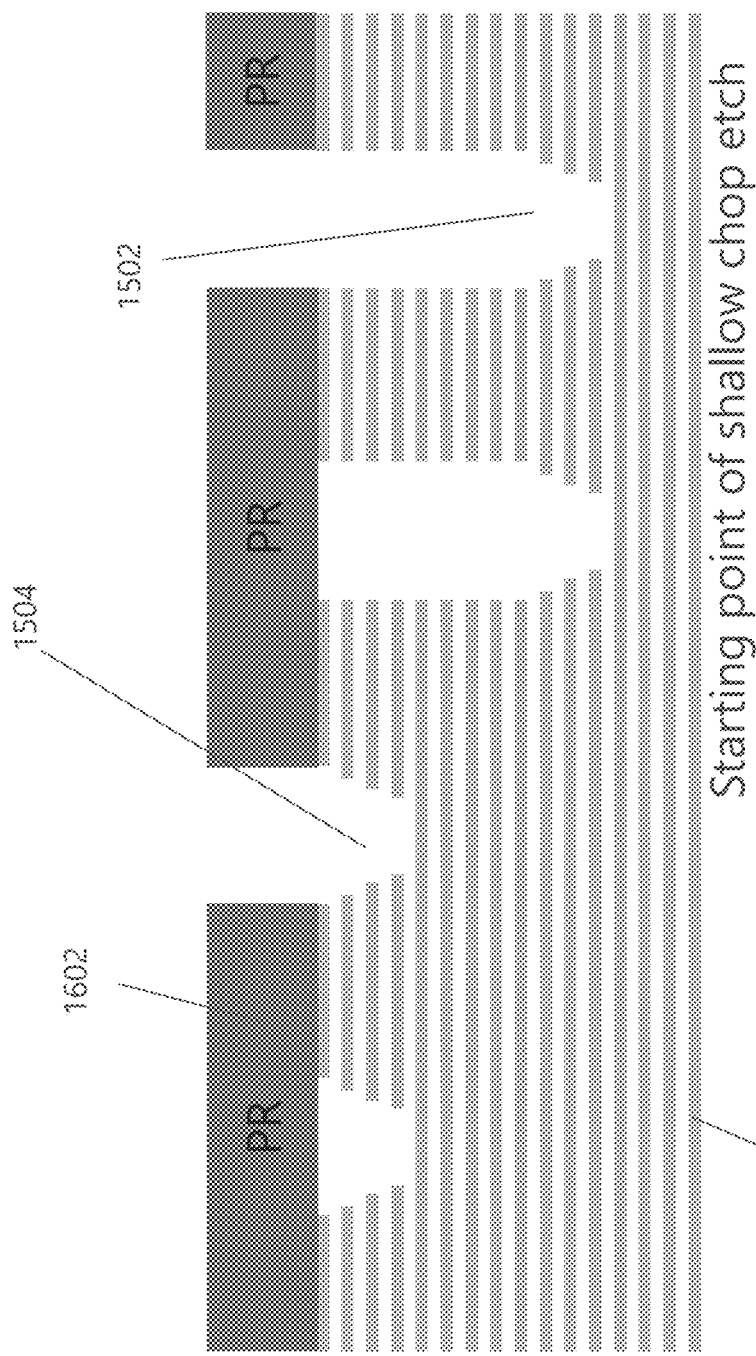

In FIG. 16, a photoresist layer 1602 is formed overlying conductive layers 1004. Photoresist layer 1602 exposes openings 1502, 1504 from the prior etches above. Other openings from the prior etches above are protected by the photoresist layer 1602, as illustrated.

Figure 17:
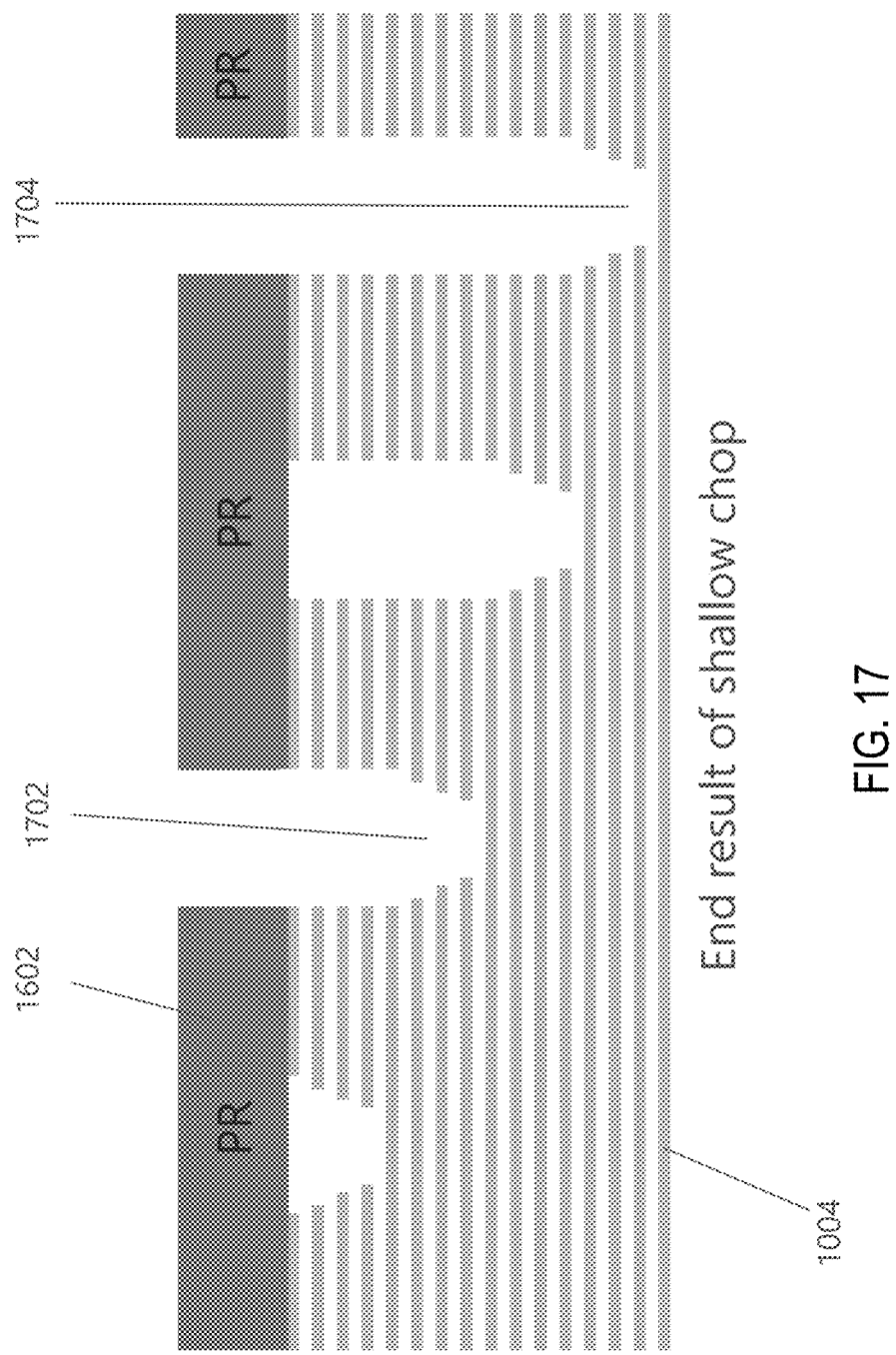

In FIG. 17, a shallow chop etch is performed to etch additional lower ones of the conductive layers 1004 (e.g., an etch of four layers is performed). The shallow chop etch further extends the depth of the exposed openings 1502, 1504 in the conductive layers 1004 to provide openings 1702 and 1704. Photoresist layer 1602 is then removed.

Figure 18:
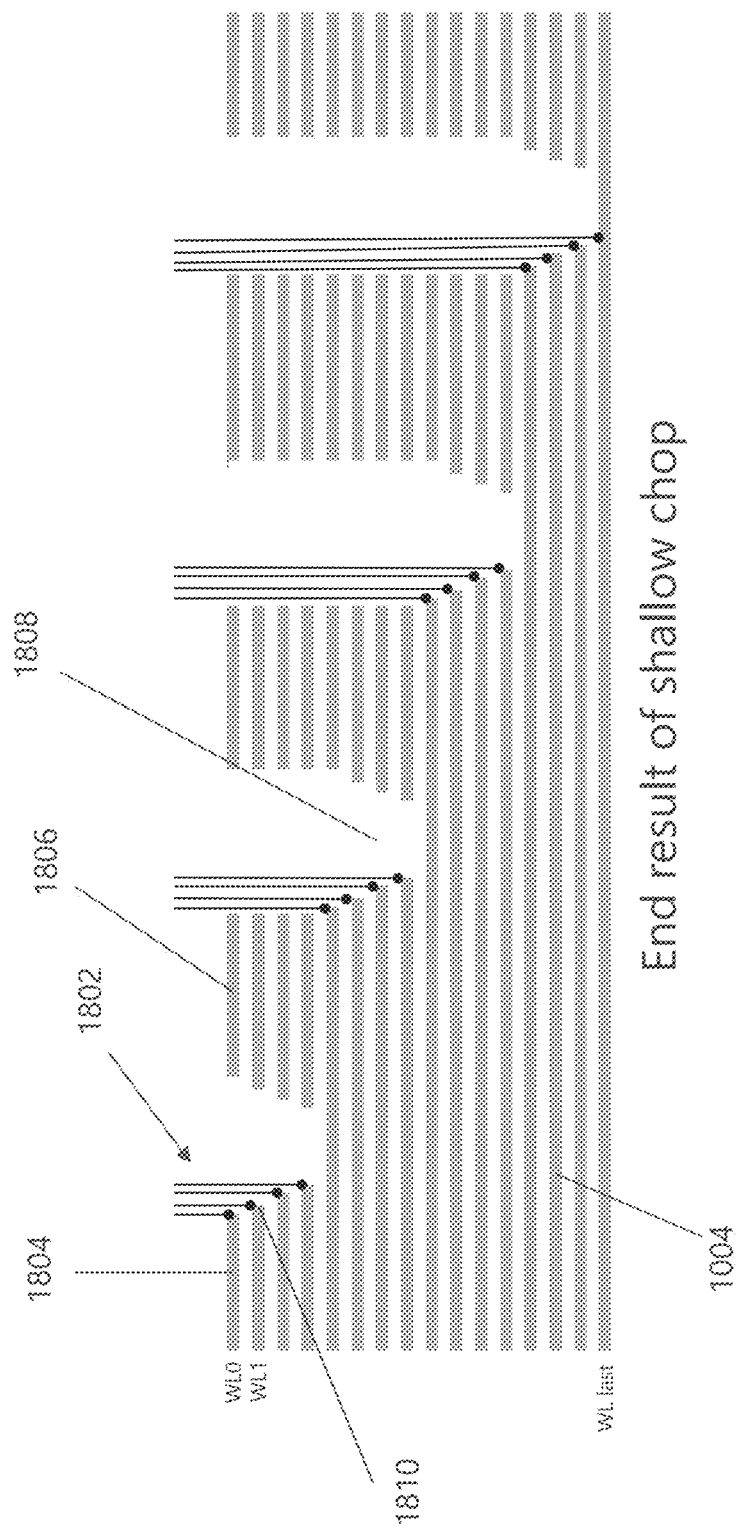
FIG. 18 illustrates a distributed staircase having contacts to landing pads on various word-line tiers of the staircase, in accordance with some embodiments.

FIG. 18 illustrates the distributed staircase formed after completion of the method above. The distributed staircase has contacts 1802 that are formed to make vertical contact to landing pads 1810 on various word-line tiers 1804 of the staircase, in accordance with some embodiments. Word-line tiers 1804 are an example of the tiers (indicated by Tier 0, 1, . . . , last) of staircase 704 of FIG. 8.

The distributed staircase includes several stadiums (e.g., stadium 1808) that descend in depth when moving down the staircase. Each stadium has a shape partially defined by the ends of the word-line tiers 1804. The word-line tiers 1804 are provided by active portions of conductive layers 1004 resulting from formation of the staircase. The shape of each stadium is also partially defined by inactive portions 1806 (also referred to as dummy treads herein), which are other portions of the conductive layers 1004 that remain after formation of the staircase, but that are not electrically connected to use in accessing the memory cells of the memory array.

In one embodiment, a memory device comprises: at least one non-volatile memory array including tiers (e.g., Tier 1 and Tier 2 of FIG. 2) for accessing data stored in a plurality of blocks of the memory array, wherein the blocks include a first block (e.g., BLK 0 of FIG. 2) having a left block portion (e.g., left block portion 212) and a right block portion (e.g., right block portion 214); a first staircase (e.g., staircase 204) positioned between the left block portion and the right block portion, wherein a bottom portion of the first staircase includes steps corresponding to first tiers of the left block portion; and a second staircase (e.g., staircase 206) positioned between the left block portion and the right block portion, wherein a top portion of the second staircase includes steps corresponding to second tiers of the right block portion; wherein the steps of the first staircase descend in a first direction (e.g., towards the Right in FIG. 2), and the steps of the second staircase descend in a second direction (e.g., towards the Left in FIG. 2) that is opposite to the first direction.

In one embodiment, the memory device further comprises conductive connectors (e.g., connectors 314 of FIG. 3) to electrically connect each of the first tiers to a corresponding one of the second tiers, wherein each corresponding first tier and second tier provides a respective logical word line (e.g., WL0, 1, . . . , last) of the first block.

In one embodiment, each of the connectors connects to a landing pad (e.g., landing pad 1810) on a step (e.g., step 308) of the first staircase and to a corresponding landing pad on a step of the second staircase.

In one embodiment, the memory device further comprises: a controller (e.g., controller 190) configured to access data stored in the first block using a first word line; and a driver (e.g., driver 121) configured to access the data using the first word line by applying a signal to the first tier and second tier that correspond to the first word line.

In one embodiment, the first direction is towards the right block portion, and the second direction is towards the left block portion.

In one embodiment, the left block portion is a lower left block portion; the right block portion is an upper right block portion; the blocks further include a second block (e.g., BLK 1) having an upper left block portion (e.g., 216) and a lower right block portion (e.g., 218); the upper left block portion is over the lower left block portion (e.g., 212); and the upper right block portion is over the lower right block portion.

In one embodiment, the memory device further comprises: a plurality of bit lines (e.g., 208) between the upper left block portion and the lower left block portion; a first source structure (e.g., 202) above the upper left block portion; and a second source structure (e.g., 210) under the lower left block portion.

In one embodiment, the memory device further comprises: a source structure (e.g., 404) between the upper left block portion and the lower left block portion; a plurality of first bit lines (e.g., 402) above the upper left block portion; and a plurality of second bit lines (e.g., 406) under the lower left block portion.

In one embodiment, a top portion of the first staircase includes steps corresponding to tiers of the upper left block portion; and a bottom portion of the second staircase includes steps corresponding to tiers of the lower right block portion.

In one embodiment, the memory device further comprises a controller configured to control a drain select signal to select one of a plurality of sub-blocks (e.g., sub-block SGD3) within the first block.

In one embodiment, the first staircase spans at least two first sub-blocks of the plurality of sub-blocks, and the second staircase spans at least two second sub-blocks of the plurality of sub-blocks.

In one embodiment, the first staircase is distributed into a plurality of stadiums, each stadium having ends of respective tiers of the memory array, and further having ends of dummy treads corresponding to the respective tiers.

In one embodiment, a layout of the blocks repeats on a two-block basis, and the blocks are separated every two blocks by a block boundary, the memory device further comprising: a third staircase including steps that descend in the first direction; and a fourth staircase including steps that descend in the second direction; wherein the third staircase is symmetrical with the first staircase along the block boundary; wherein the fourth staircase is symmetrical with the second staircase along the block boundary.

In one embodiment, the left block portion has a word line order starting from an initial left word line and continuing to a last left word line in a first physical direction; the right block portion has a word line order starting from an initial right word line and continuing to a last right word line in a second physical direction; and the first physical direction is opposite to the second physical direction.

In one embodiment, the initial left word line is electrically connected to the initial right word line; and the last left word line is electrically connected to the last right word line.

In one embodiment, a method comprises: forming a first staircase and a second staircase; wherein the first staircase is positioned between a left block portion and a right block portion of a first block that stores data in at least one non-volatile memory array, a bottom portion of the first staircase includes steps corresponding to lower tiers of the left block portion, and the lower tiers are configured as word lines to access data stored in the left block portion; wherein the second staircase is positioned between the left block portion and the right block portion, a top portion of the second staircase includes steps corresponding to upper tiers of the right block portion, and the upper tiers are configured as word lines to access data stored in the right block portion; wherein the steps of the first staircase descend in a first direction, and the steps of the second staircase descend in a second direction that is opposite to the first direction.

In one embodiment, forming the first staircase comprises: forming a plurality of conductive layers (e.g., 1004) associated with the first staircase, wherein the conductive layers are separated by insulating layers (e.g., 1006), and each conductive layer corresponds to a respective lower tier of the left block portion; performing a repeated trim and etch sequence for a first number of the conductive layers to provide first openings; performing a first chop etch to extend a depth of a first portion of the first openings to provide second openings, the first chop etch including etching a second number of the conductive layers located at a lower depth than the first number of the conductive layers; and performing a second chop etch to extend a depth of a second portion of the first openings and to extend a depth of a first portion of the second openings, wherein a depth of the second chop etch is less than a depth of the first chop etch.

In one embodiment, performing the second chop etch provides a plurality of first stadiums (e.g., 1808) of the first staircase, each first stadium comprising first landing pads (e.g., 1810) for the lower tiers of the left block portion. The method further comprises forming a respective first contact (e.g., 1802) to each first landing pad.

In one embodiment, forming the second staircase comprises forming a plurality of second stadiums of the second staircase, each second stadium comprising second landing pads for the upper tiers of the right block portion, and forming a respective second contact to each second landing pad. The method further comprises: connecting, using a metal connector, each first contact to a logically corresponding one of the second contacts.

In one embodiment, the first staircase and the second staircase are formed by the same staircase processing steps.

In one embodiment, a memory device comprises: at least one memory array including a first block portion and a second block portion; a first staircase positioned between the first block portion and the second block portion, wherein the first staircase includes steps corresponding to tiers of the first block portion; and a second staircase positioned between the first block portion and the second block portion, wherein the second staircase includes steps corresponding to tiers of the second block portion; wherein the steps of the first staircase descend in a first direction, and the steps of the second staircase descend in a second direction that is opposite to the first direction.

Closing

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/ or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A memory device comprising:
a plurality of tiers formed by a stack of conductive layers separated by insulating layers for accessing data stored in a plurality of blocks of the memory array, wherein:
the blocks include a first block having a left block portion and a right block portion;
a first staircase positioned between the left block portion and the right block portion, wherein the first staircase descends from left to right with each step in the first staircase formed by one of the stack of conductive layers with a bottom step of the first staircase formed by a first conductive layer, and a bottom portion of the first staircase includes steps corresponding to first tiers of the left block portion;
a second staircase positioned between the left block portion and the right block portion and adjacent to the first staircase, wherein the second staircase descends from right to left with each step in the second staircase formed by one of the stack of conductive layers with a bottom step of the second staircase formed by the first conductive layer, and a top portion of the second staircase includes steps corresponding to second tiers of the right block portion; and
a third staircase positioned between the left block portion and the right block portion, wherein each step of the third staircase is formed by one of the stack of conductive layers with a bottom step of the third staircase formed by a second conductive layer different from the first conductive layer.

2. The memory device of claim 1, wherein:
the left block portion has a word line order starting from an initial left word line and continuing to a last left word line in a first physical direction;
the right block portion has a word line order starting from an initial right word line and continuing to a last right word line in a second physical direction, wherein
the first physical direction is opposite to the second physical direction;
the initial left word line is electrically connected to the initial right word line; and
the last left word line is electrically connected to the last right word line.

3. The memory device of claim 1, further comprising conductive connectors to electrically connect each of the first tiers to a corresponding one of the second tiers, wherein each corresponding first tier and second tier provides a respective logical word line of the first block.

4. The memory device of claim 3, wherein each of the connectors connects to a landing pad on a step of the first staircase and to a corresponding landing pad on a step of the second staircase.

5. The memory device of claim 1, further comprising:
a controller configured to access data stored in the first block using a first word line; and
a driver configured to access the data using the first word line by applying a signal to the first tier and second tier that correspond to the first word line.

6. The memory device of claim 1, wherein:
the left block portion is a lower left block portion;
the right block portion is an upper right block portion;
the blocks further include a second block having an upper left block portion and a lower right block portion;
the upper left block portion is over the lower left block portion; and
the upper right block portion is over the lower right block portion.

7. The memory device of claim 6, further comprising:
a plurality of bit lines between the upper left block portion and the lower left block portion;
a first source structure above the upper left block portion; and
a second source structure under the lower left block portion.

8. The memory device of claim 6, further comprising:
a source structure between the upper left block portion and the lower left block portion;
a plurality of first bit lines above the upper left block portion; and
a plurality of second bit lines under the lower left block portion.

9. The memory device of claim 6, wherein:
a top portion of the first staircase includes steps corresponding to tiers of the upper left block portion; and
a bottom portion of the second staircase includes steps corresponding to tiers of the lower right block portion.

10. The memory device of claim 1, wherein the first staircase is distributed into a plurality of stadiums, each stadium having ends of respective tiers of the memory array.

11. The memory device of claim 1, wherein the steps of the first staircase descend in a first direction, and the steps of the second staircase descend in a second direction that is opposite to the first direction.

12. The memory device of claim 11, wherein the first direction is towards the right block portion, and the second direction is towards the left block portion.

13. The memory device of claim 11, wherein a layout of the blocks repeats on a two-block basis, and the blocks are separated every two blocks by a block boundary, the memory device further comprising:
a third staircase including steps that descend in the first direction; and
a fourth staircase including steps that descend in the second direction;
wherein the third staircase is symmetrical with the first staircase along the block boundary;
wherein the fourth staircase is symmetrical with the second staircase along the block boundary.

14. A method comprising:
forming a first staircase in a stack of conductive layers separated by insulating layers, the conductive layers providing access to a memory block, wherein the first staircase is positioned between a left block portion and a right block portion of the memory block, and the first staircase descends from left to right with each step in the first staircase formed by one of the stack of conductive layers with a bottom step of the first staircase formed by a first conductive layer;
forming a second staircase in the stack of conductive layers adjacent to the first staircase, wherein the second staircase is positioned between the left block portion and the right block portion, and the second staircase descends from right to left with each step in the second staircase formed by one of the stack of conductive layers with a bottom step of the second staircase formed by the first conductive layer; and
forming a third staircase in the stack of conductive layers, wherein the third staircase is positioned between the left block portion and the right block portion with a bottom step of the third staircase formed by a second conductive layer different from the first conductive layer.

15. The method of claim 14, wherein the left block portion has a word line order starting from an initial left word line and continuing to a last left word line in a first physical direction; and the right block portion has a word line order starting from an initial right word line and continuing to a last right word line in a second physical direction; and wherein the first physical direction is opposite to the second physical direction.

16. The method of claim 14, wherein forming the first staircase comprises:
   etching a plurality of the stack of conductive layers; and
   performing at least one chop etch.

17. The method of claim 16, wherein performing the at least one chop etch provides a plurality of stadiums of the first staircase.

18. The method of claim 14, wherein forming the first staircase comprises forming a plurality of stadiums of the first staircase.

19. A memory device comprising:
   at least one memory array;
   a first staircase including steps corresponding to first tiers of the memory array, a bottom step of the first staircase formed by a first conductive layer;
   a second staircase including steps corresponding to second tiers of the memory array, wherein the steps of the first staircase descend in a first direction, and the steps of the second staircase descend in a second direction that is opposite to the first direction, a bottom step of the second staircase formed by the first conductive layer;
   conductive connectors to electrically connect each of the first tiers to a corresponding one of the second tiers; and
   a third staircase disposed in a vicinity of the first and the second staircase, a bottom step of the third staircase formed by a second conductive layer different from the first conductive layer.

20. The memory device of claim 19, wherein each corresponding first tier and second tier provides a respective logical word line of the memory array.

* * * * *